United States Patent [19]

Dinh

[11] Patent Number: 5,801,987
[45] Date of Patent: Sep. 1, 1998

[54] AUTOMATIC TRANSITION CHARGE PUMP FOR NONVOLATILE MEMORIES

[75] Inventor: Khoi Van Dinh, Austin, Tex.

[73] Assignee: Motorola, Inc., Schaumburg, Ill.

[21] Appl. No.: 818,273

[22] Filed: Mar. 17, 1997

[51] Int. Cl.$^6$ ............................. G11C 11/34
[52] U.S. Cl. ................. 365/185.18; 365/185.22; 365/185.23; 365/158.29; 365/185.33
[58] Field of Search .............. 365/185.18, 185.22, 365/185.23, 185.29, 185.33, 218, 226; 327/536

[56] References Cited

U.S. PATENT DOCUMENTS

| | | | |
|---|---|---|---|
| 5,428,568 | 6/1995 | Kobayashi et al. | 365/185.18 |
| 5,511,026 | 4/1996 | Cleveland et al. | 365/226 |
| 5,594,692 | 1/1997 | Yamaguchi | 365/185.29 |
| 5,629,646 | 5/1997 | Menezes et al. | 327/536 |

Primary Examiner—David C. Nelms
Assistant Examiner—Trong Phan
Attorney, Agent, or Firm—Daniel D. Hill

[57] ABSTRACT

Clock frequency and number of stages of a charge pump for nonvolatile memories are automatically adjusted to compensate for lower efficiency due to lower power supply, higher temperature, or weaker process. A low voltage detector will cause the charge pump to increase the charge pump's clock frequency and number of stages when a low voltage is detected, making the charge pump's capability constant over a voltage range. A counter timing programming/erasing time will cause the charge pump clock frequency and number of stages to increase when the programming/erasing time exceeds certain thresholds. This boosts the charge pump's drivability for a weaker process, higher temperature, or aged cells.

28 Claims, 6 Drawing Sheets

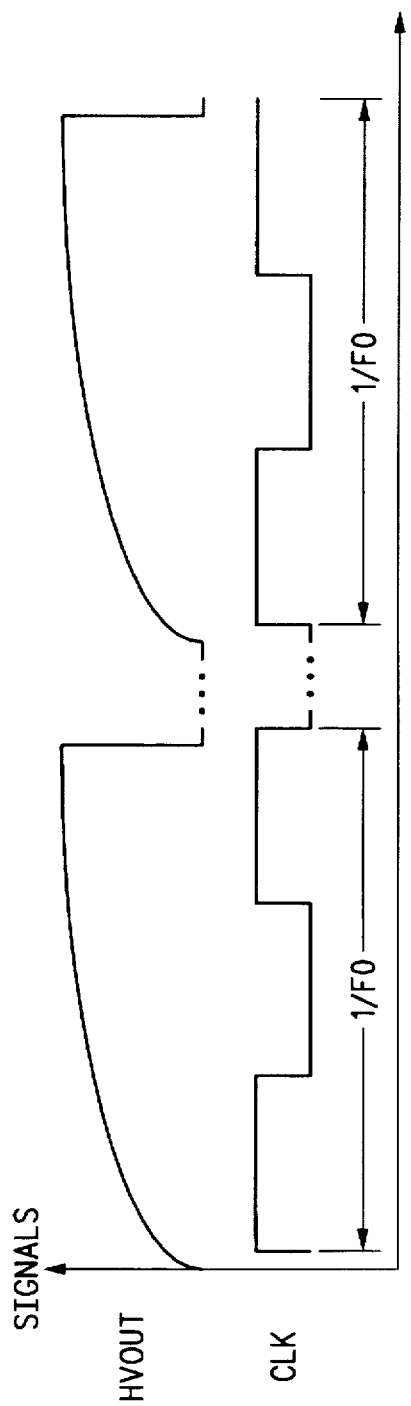
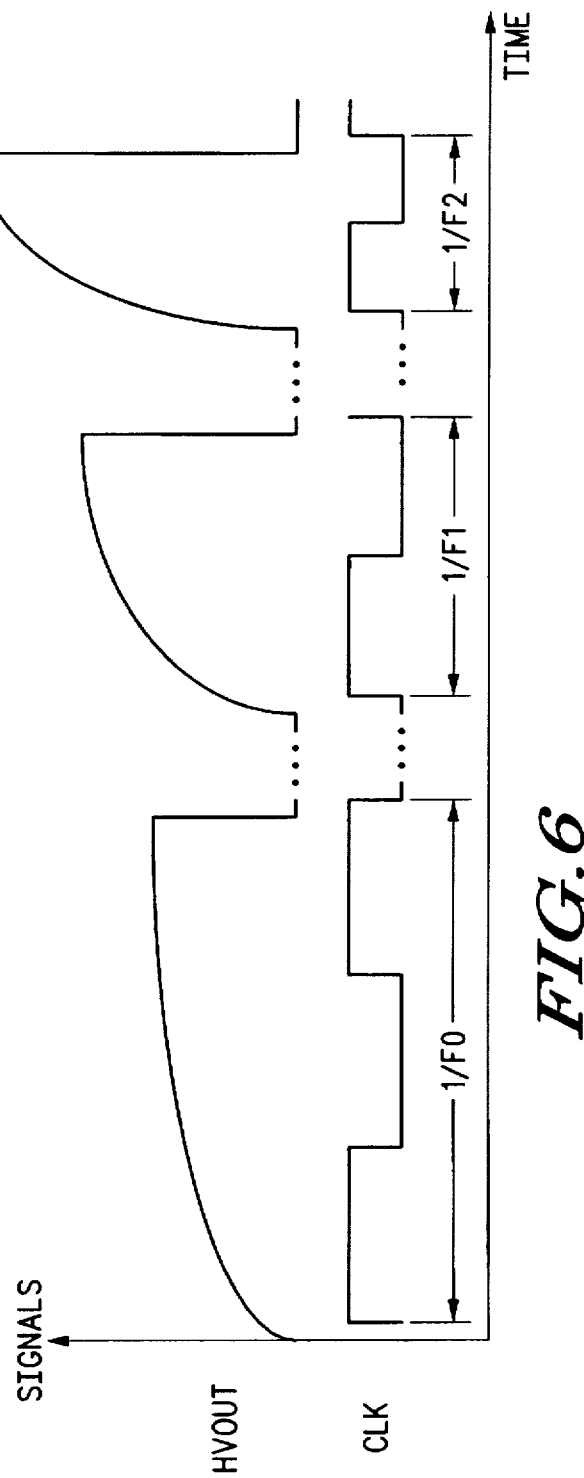

AUTOMATIC TRANSITION CHARGE PUMP FOR NONVOLATILE MEMORIES

FIELD OF THE INVENTION

This invention relates generally to nonvolatile memories and more particularly to a charge pump for a nonvolatile memory.

BACKGROUND OF THE INVENTION

An Electrically Erasable Programmable Read Only Memory (EEPROM) is a type of nonvolatile memory that is reprogrammable. EEPROM cells are arranged in an array and located at the intersections of rows and columns. Nonvolatile memory, such as an EEPROM cell, generally includes a floating gate transistor. The floating-gate transistor can be programmed or erased by applying a very highly differential voltage (currently 18-20 volts) between the control electrode and the drain, source, or substrate. Tunneling causes electrons to be transferred to or from the floating-gate through a thin tunneling oxide layer. Note that for EEPROM cells, electrons can tunnel from substrate, drain, or source, depending on technology. As charge builds up on the floating-gate, the electric field is reduced, decreasing electron flow. Programming/erasing is typically accomplishing using several programming/erasing cycles. Each such programming/erasing cycle is followed by a verify cycle. Programming/erasing is complete when the verify cycle indicates that the cells have been properly programmed/erased. An example program/verify cycle is illustrated in FIG. 5 and is discussed later.

An EEPROM is limited in the number of programming/erasing cycles it can experience before failure due to overstress. The overstress is caused by the high programming/erasing voltage pulses. The peak tunneling current has a direct bearing on EEPROM reliability and service life, and is related to the ramp-up rate of the programming/erasing voltage pulse. If the ramp-up rate of the programming/erasing voltage pulse is too high, the peak tunneling current may overstress the thin tunneling oxide layer, resulting in reduced reliability and shortened service life.

Typically, a charge pump, located on the same integrated circuit as the EEPROM array is used to generate the programming/erasing voltage. The charge pump usually includes a plurality of series-connected pump stages that are driven by two nonoverlapping clock signals. The series-connected pump stages multiply the amplitude of the clock signals. The actual voltage obtained at the charge pump output terminal depends on the number of pump stages, the clock frequency, and on the charge transfer efficiency of the pump stages.

It may be desirable for an integrated circuit having a non-volatile memory to operate at more than one power supply voltage. However, a charge pump designed to operate with, for example a 5.0 volt power supply, may not operate with, for example a 3.0 volt power supply, because the magnitude of the output of the charge is dependent on the power supply voltage. In addition to being supply voltage dependent, a charge pump may also be temperature and process dependent, causing the clock frequency to vary with process and temperature variations.

BRIEF DESCRIPTION OF THE DRAWINGS

FIG. 5 illustrates a timing diagram of output voltage HVOUT and clock signal CLK in accordance with the prior art.

FIG. 6 illustrates a timing diagram of output voltage HVOUT and clock signal CLK in accordance with the present invention.

DETAILED DESCRIPTION

Generally, the present invention provides a high voltage charge pump for programming a non-voltage memory that can operate at more than one power supply voltage. A low voltage detector is used to automatically determine the voltage at which an integrated circuit having the charge pump is operating. Upon detecting the voltage of the power supply, the low voltage detector determines the number of pump stages required to produce a predetermined high voltage output set, and sets the operating frequency of a clock generator. The charge pump also includes a timer for controlling the duration of the programming cycles and the magnitude of the output voltage for each of the programming cycles. After a first programming cycle, subsequent programming cycles use an increased the program voltage to the memory array with a shorten time duration, thus improving reliability of the cells and improving current reliability of the charge pump. Also, temperature and process variations may be compensated for. Note that this also applies to erasing cells.

The present invention can be more fully described with reference to FIGS. 1–7. The terms "assert" and "negate" will be used when referring to the rendering of a signal, status bit, integrated circuit pin, or similar apparatus into its logically true or logically false state, respectively. If the logically true state is a logic level one, the logically false state will be a logic level zero. And if the logically true state is a logic level zero, the logically false state will be a logic level one.

Figure 1:
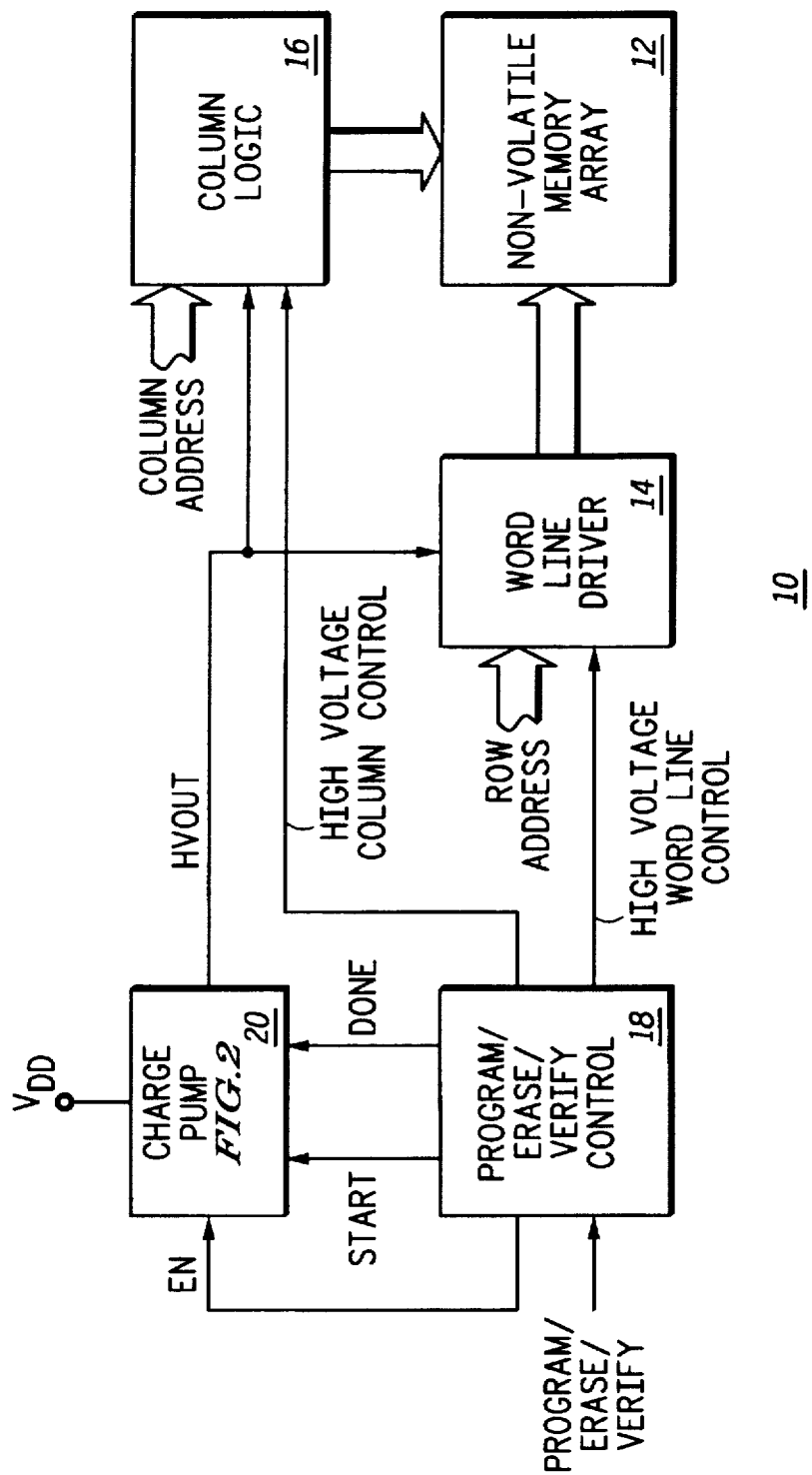
FIG. 1 illustrates, in block diagram form, a non-volatile memory in accordance with the present invention.

FIG. 1 illustrates, in block diagram form, non-volatile memory 10 in accordance with the present invention. Non-volatile memory 10 includes non-volatile memory array 12, word line driver circuit 14, column logic 16, program/erase/verify control 18, and charge pump 20. Non-volatile memory array 12 includes a plurality of non-volatile memory cells (not shown) coupled to word lines and bit lines. Word line driver circuit 14 receives a plurality of row address signals, labeled "ROW ADDRESS", and provides decoded word line signals to non-volatile memory array 12 for selecting one of the word lines. Likewise, column logic 16 receives a plurality of column address signals, labeled "COLUMN ADDRESS", for coupled a bit line in non-volatile memory array 12 to input/output circuitry (not shown).

Charge pump 20 provides a high voltage output set labeled HVOUT to word line driver 14 and column logic 16. Program/erase/verify control circuit 18 receives control signals labeled "PROGRAM/ERASE/VERIFY" for controlling programming/erasing/verifying of the memory cells of non-volatile memory array 12. Program/erase/verify control circuit 18 provides an enable signal labeled "EN" to charge pump 20. Enable signal EN is used to start and stop the clock generator 22 (See FIG. 2). Program/erase/verify control 18 also provides a control signal labeled "START" and a control signal labeled "DONE", the operation of control signal START and control signal DONE will be described later in connection with FIG. 2. In addition, program/erase/ verify control 18 provides a high voltage word line control signal to word line driver 14 and a high voltage column control signal to column logic 16. These signals are used for both program and erasing of non-volatile memory array 12. Note that for purposes of simplicity here, programming and erasing non-volatile memory array 12 can be done by conventional means and will not be described in detail in this application for patent.

Figure 2:
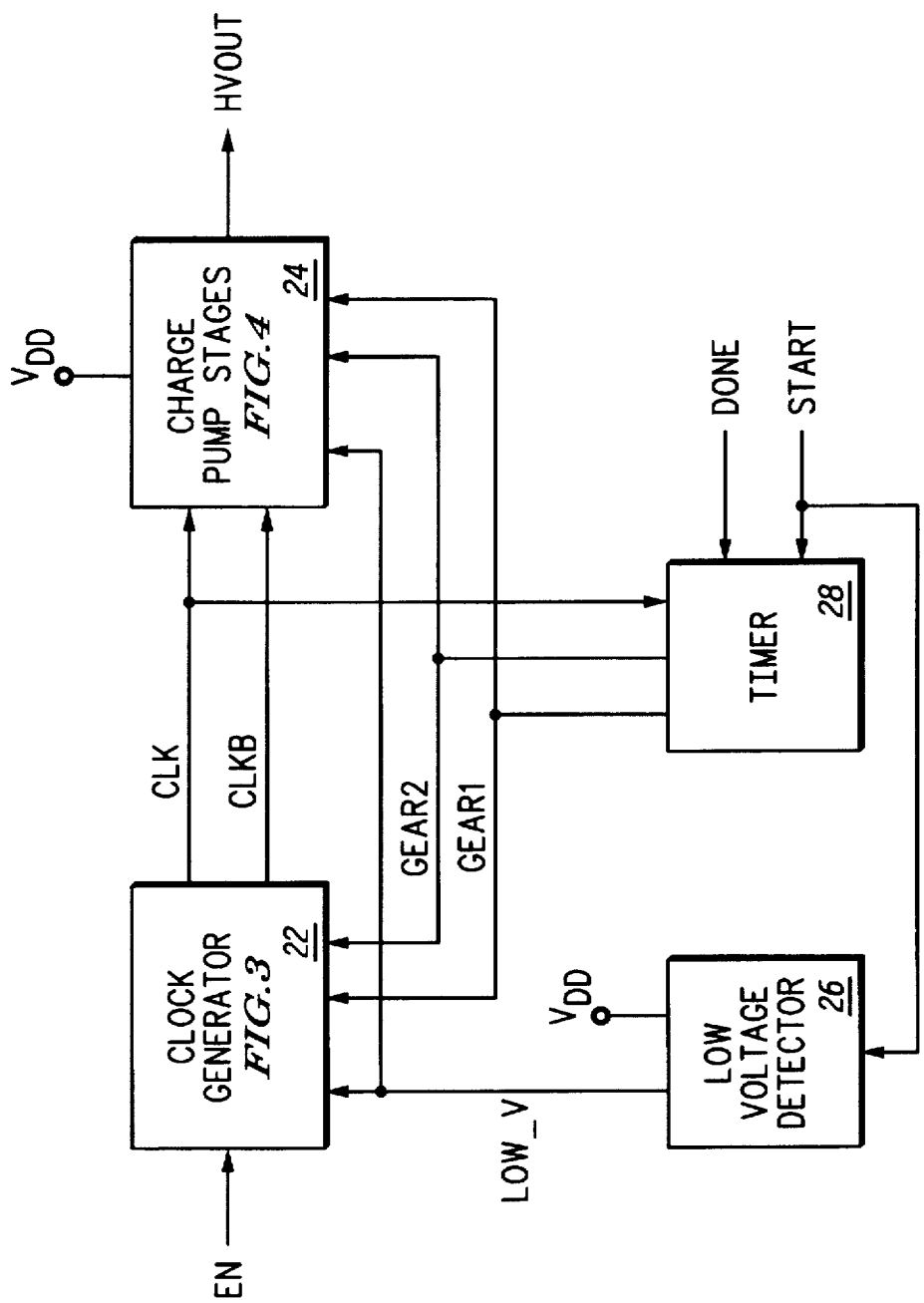
FIG. 2 illustrates, in block diagram form, the charge pump of FIG. 1 in more detail.

FIG. 2 illustrates, in block diagram form, charge pump 20 of FIG. 1. Charge pump 20 includes a clock generator 22, a plurality of charge pump stages 24, a low voltage detector 26, and a timer 28. Clock generator 22 has an input terminal for receiving enable signal EN and complementary output terminals for providing a clock signal labeled "CLK" and a clock signal labeled "CLKB", respectively. Clock signals CLK and CLKB are non-overlapping complementary clock signals used to control the pumping operation of charge pump stages 24. Charge pump stages 24 includes a plurality of conventional charge pump stages for providing a high voltage output set labeled "HVOUT".

Charge pump 20 in the illustrated embodiment is able to operate with either a 5 volt power supply or a 3 volt power supply. Low voltage detector 26 is connected to the power supply voltage and is used to determine whether the power supply voltage is at 5 volts or at 3 volts. Note that the power supply voltages described in this patent application are for illustration purposes only and that other power supply voltages could be used. In response to detecting that the power supply voltage is lower than 5 volts, low voltage detector 26 provides a control signal labeled "LOW_V" to control the frequency of clock generator 22. When the power supply voltage is at 5 volts, the operating frequency of clock generator 22 does not need to be as high as when the power supply voltage is at 3 volts in order to produce the same high voltage output set HVOUT. In the illustrated embodiment, for a 5 volt power supply, the required frequency of clock signals CLK/CLKB is about one half the frequency as required for a 3 volt power supply voltage. When low voltage detector 26 detects a low power supply voltage, i.e. 3 volts, control signal LOW_V is provided to pump stages 24 to select a predetermined number of stages for provides high voltage output set HVOUT. Fewer stages are needed for a higher power supply voltage than are needed for a relatively lower power supply voltage in order to produce the same output voltage.

During a program/verify cycle, timer circuit 28 receives a control signal labeled "START", a control signal labeled "DONE", and clock signal CLK. In response, timer 28 provides control signal labeled "GEAR1" and a control signal labeled "GEAR2" to both clock generator 22 and charge pump stages 24. Control signal START is also provided to low voltage detector 26. During the program portion of the program/verify cycle of non-volatile memory 10, the control signal PROGRAM is provided to program/ erase/verify control 18. Program/erase/verify control 18 then asserts enable signal EN which enables clock generator 22 to begin outputting clock signals CLK and CLKB to pump stages 24. The voltage of high voltage output set HVOUT will then begin increasing to the required program voltage. After enable signal EN is asserted, control signal START is asserted, which enables low voltage detector 26 and begins a counter located in timer circuit 28. After low voltage detector 26 determines which power supply voltage is being provided to the integrated circuit, control signal LOW_V is asserted to control the frequency of clock generator 22. When the counter in timer circuit 28 reaches a predetermined time (i.e. 2 milliseconds), control signal GEAR1 is asserted, causing the frequency provided by clock generator 22 to be increased and selects the number of pump stages needed to produce the high voltage output set HVOUT. After a second predetermined time, control signal GEAR2 is asserted causing the frequency of clock signals CLK and CLKB to increase, and also increasing the number of pump stages used in pump stages 24 to produce an increased voltage HVOUT for subsequent programming cycles. The subsequent programming cycles also have a shorter duration than the initial programming cycle. This is to reduce overstress caused by the high programming voltage pulses, thus increasing the useful life of the memory cells.

After the program/verify cycle is complete, indicating that the memory array is properly programmed, then control signal DONE is asserted deactivating timer 28. Also, control signal PROGRAM is negated which causes enable signal EN to be turned off, or negated, thus turning off clock generator 22 to reduce power consumption. Also, enable signal EN is turned off each time a program cycle ends and a verified cycle begins. In other words, clock generator 22 is only operating during the time needed to provide output voltage HVOUT.

Charge pump 20 provides the advantage of automatically determining the power supply voltage and adjusting the clock frequency provided to the charge pump stages to correspond with the power supply voltage. In addition, during a program/verify cycle, the voltage of output voltage HVOUT of subsequent programming cycles is increased while the duration of the application of output voltage HVOUT is decreased. By increasing the program voltage to the memory array and decreasing the amount of time the cells receive the program voltage, reliability of the cells is improved and the current reliability of the charge pump is improved. Also, compensation can be provided for process and temperature variations and for aged cells. Aged cells are cells that have degraded performance due numerous program/erase cycles.

Figure 3:
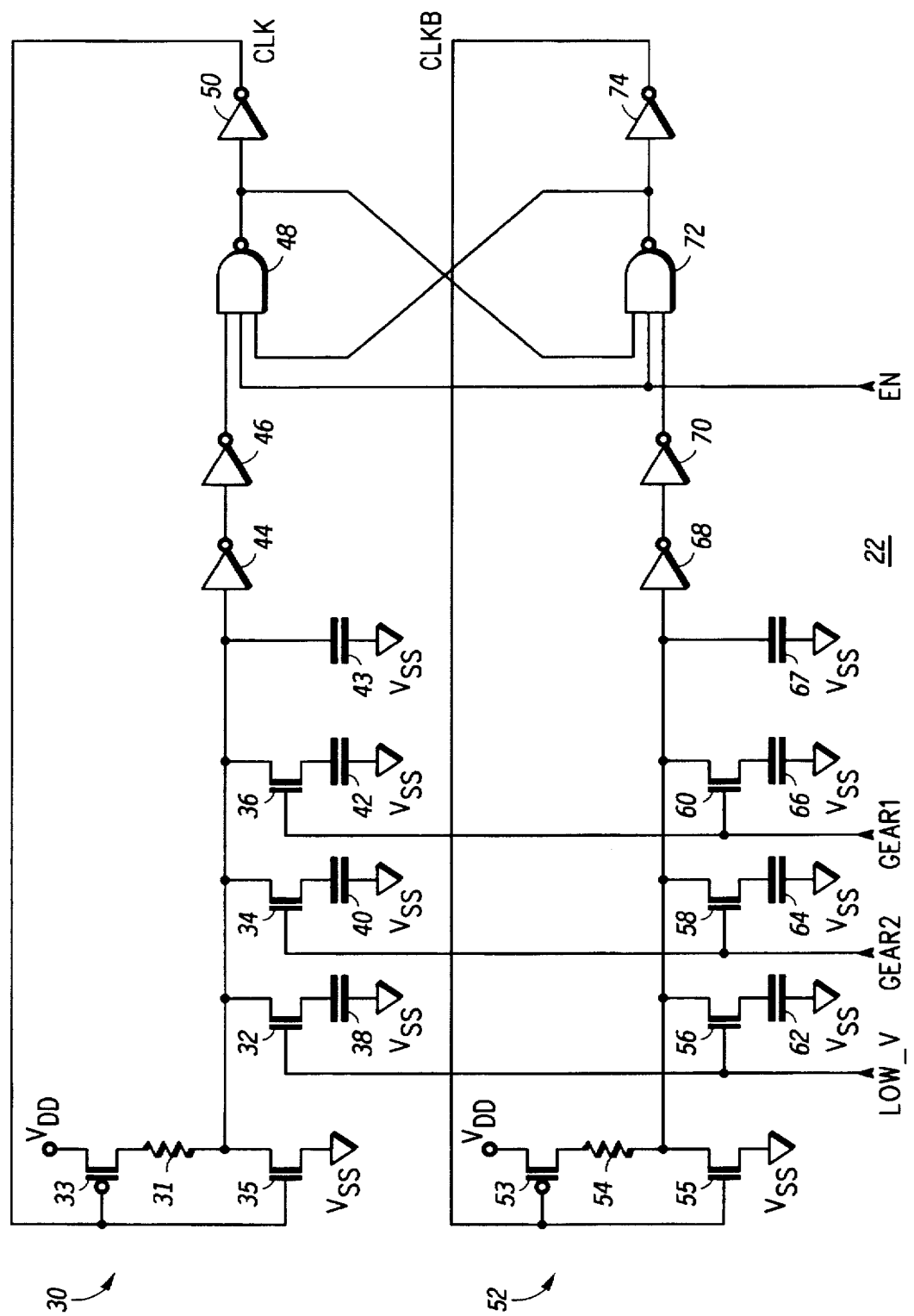
FIG. 3 illustrates, in partial schematic diagram form and partial logic diagram form, the clock generator of FIG. 2 in more detail.

FIG. 3 illustrates, in partial schematic diagram form and partial logic diagram form, clock generator 22 of FIG. 2. Clock generator 22 includes inverters 30, 44, 46, 50, 52, 68, 70 and 74, N-channel transistors 32, 34, 36, 56, 58, and 60, capacitors 38, 40, 42, 43, 62, 64, and 66, 67 and NAND logic gates 48 and 72. Inverter 30 includes a P-channel transistor 33, an N-channel transistor 35 and a resistor 31. Inverter 52 includes a P-channel transistor 53, an N-channel transistor 55, and a resistor 54.

Clock generator 22 functions as a ring oscillator and provides non-overlapping clock signals CLK and CLKB where CLKB is a logical complement of CLK. The clock frequency of clock generator 22 depends on the capacitance coupled to the input of inverter 44. Note that the capacitance of capacitor 42 is C, the capacitance of capacitor 40 is 2C and the capacitance of capacitor 38 is 3C. If control signal LOW_V is asserted as a logic high, N-channel transistor 32 is conductive, coupling capacitor 38 to the input terminal of inverter 44. If control signal GEAR2 is asserted as a logic high, N-channel transistor 34 is conductive, coupling capacitor 40 to the input terminal of inverter 44. If control signal GEAR1 is asserted as a logic high, N-channel transistor 36 is conductive, coupling capacitor 42 to the input terminal of inverter 44. Base capacitor 43 is also coupled to the input terminal of inverter 44. The frequency of clock signal CLK is dependent on the resistance of resistor 31 and the total capacitance coupled to the input of inverter 44. As the capacitance coupled to the input terminal of inverter 44 increases, the frequency of clock signal CLK decreases. NAND gates 48 and 72 are cross-coupled to allow clock signals CLK and CLKB to be non-overlapping. Enable signal EN is used to enable or disable clock generator 22.

Figure 4:
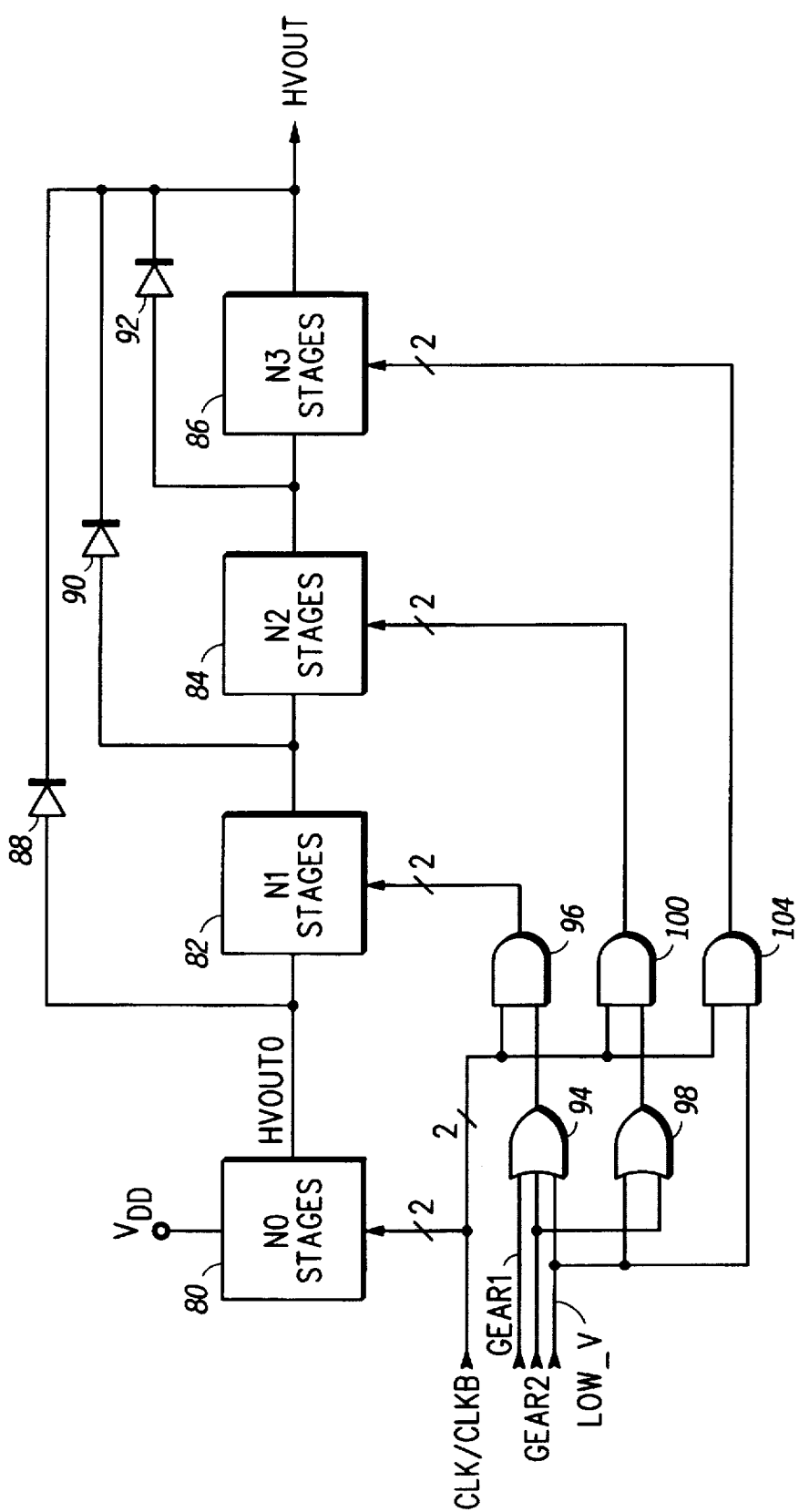
FIG. 4 illustrates, in partial block diagram form and partial logic diagram form, the charge pump stages of FIG. 2.

FIG. 4 illustrates, in partial block diagram form and partial logic diagram form, pump stages 24 of FIG. 2. Charge pump stages 24 includes a first plurality of pump stages 80, a second plurality of pump stages 82, a third plurality of pump stages 84, and a fourth plurality of pump stages 86. These pump stages are coupled together in series and include a plurality of conventional pump stages to provide output voltage HVOUT. The voltage of HVOUT is dependent upon the number of pump stages coupled in series, as well as the frequency of clock signals CLK and CLKB. Diodes 88, 90, and 92 are used to provide a backward bias protection for the plurality of pump stages 80, 82, 84, and 86. Also, included in charge pump stages 24 are OR logic gates 94 and 98 and AND logic gates 96, 100 and 104.

In operation, when control signal LOW_V is a logic high, all of the pump stages 80, 82, 84 and 86 are coupled together to provide output voltage HVOUT. If control signal LOW_V is a logic low and control signals GEAR1 and GEAR2 are logic lows, output voltage HVOUT is equal to output voltage HVOUT0 which becomes the output of pump stages 80. In addition to controlling the output voltage of HVOUT by controlling the number of pump stages connected in the series, output voltage HVOUT is also controlled by the frequency of clock signals CLK and CLKB. Note that the logic gates illustrated in FIG. 4 represent logic functions and are not the actual logic gates to be implemented in an actual integrated circuit since various combinations of logic gates can be combined to provide the same result.

FIG. 5 illustrates a timing diagram of output voltage HVOUT and clock signal CLK in accordance with the prior art. Illustrated in FIG. 5 is a program cycle during the first time period labeled "1/F0", a verify cycle, and then another program cycle during the second time period labeled "1/F0". During a program cycle, the program voltage is provided to the cell to be programmed in memory array 12 for a time duration equal to 1/F0. After the program cycle, the program voltage is reduced to zero volts and clock CLK/CLKB is stopped. The memory cell is read to determine if the cell was successfully programmed. If not, the subsequent program cycle is started, the subsequent program cycle has the same duration 1/F0 as the first program cycle. This is again followed by another verify cycle. The cell is repetitively programmed and verified until it is determined that the cell has been successfully programmed. A problem with the prior art method of programming and verifying as illustrated in FIG. 5 is that the duration of 1/F0 may cause undue stress in the cell to be programmed over time, resulting in reduced reliability of the cell. In some non-volatile memory systems, as many as 100 program verify cycles may be required.

FIG. 6 illustrates a timing diagram of output voltage HVOUT and clock signal CLK in accordance with the present invention. In FIG. 6 the output voltage HVOUT is applied to a cell to be programmed for time period 1/F0. Time period 1/F0 is determined by a predetermined number of clock cycle of CLK/CLKB. Timer 28 in FIG. 2 is started when voltage HVOUT is provided to the cell. A verify cycle follows the first program cycle, then control signal GEAR1 from timer 28 is asserted which increases the frequency of clock signal CLK/CLKB, so that 1/F1 is less than 1/F0, as illustrated in FIG. 6. At the same time, the number of pump stages of charge pump stages 24, illustrated in FIG. 4, is increased to include pump stages 80 and 82. Assuming that control signal LOW_V is negated, indicating that the higher power supply voltage has been detected, the higher clock frequency decreases the duration at which output voltage HVOUT is applied, and the number of pump stages are increased to increase the magnitude of output voltage HVOUT. Another verify cycle follows, as indicated by HVOUT decreasing to zero volts. Note that, for purposes of simplicity and clarity, HVOUT decreases at a rate which is not illustrated in FIG. 6.

At the next program cycle, timer circuit 28 (FIG. 2) asserts control signal GEAR2 causing the number of pump stages of charge pump stages 24 to be increased by pump stages 80, 82 and 84. In addition, clock generator 22 provides clock signal CLK at a frequency that provides a time period equal to 1/F2, where 1/F2 is shorter than 1/F1, as illustrated in FIG. 6. Therefore, the third program cycle illustrated in FIG. 6 has a shorter duration and a higher amplitude than the previous program cycle. In the illustrated embodiment any subsequent program steps that are required will have the same duration and magnitude as the third program cycle illustrated in FIG. 6. When the programming of non-volatile memory array 12 has been successfully programmed, as determined by a verify cycle, control signal DONE is asserted, indicating that programming is complete.

Figure 7:
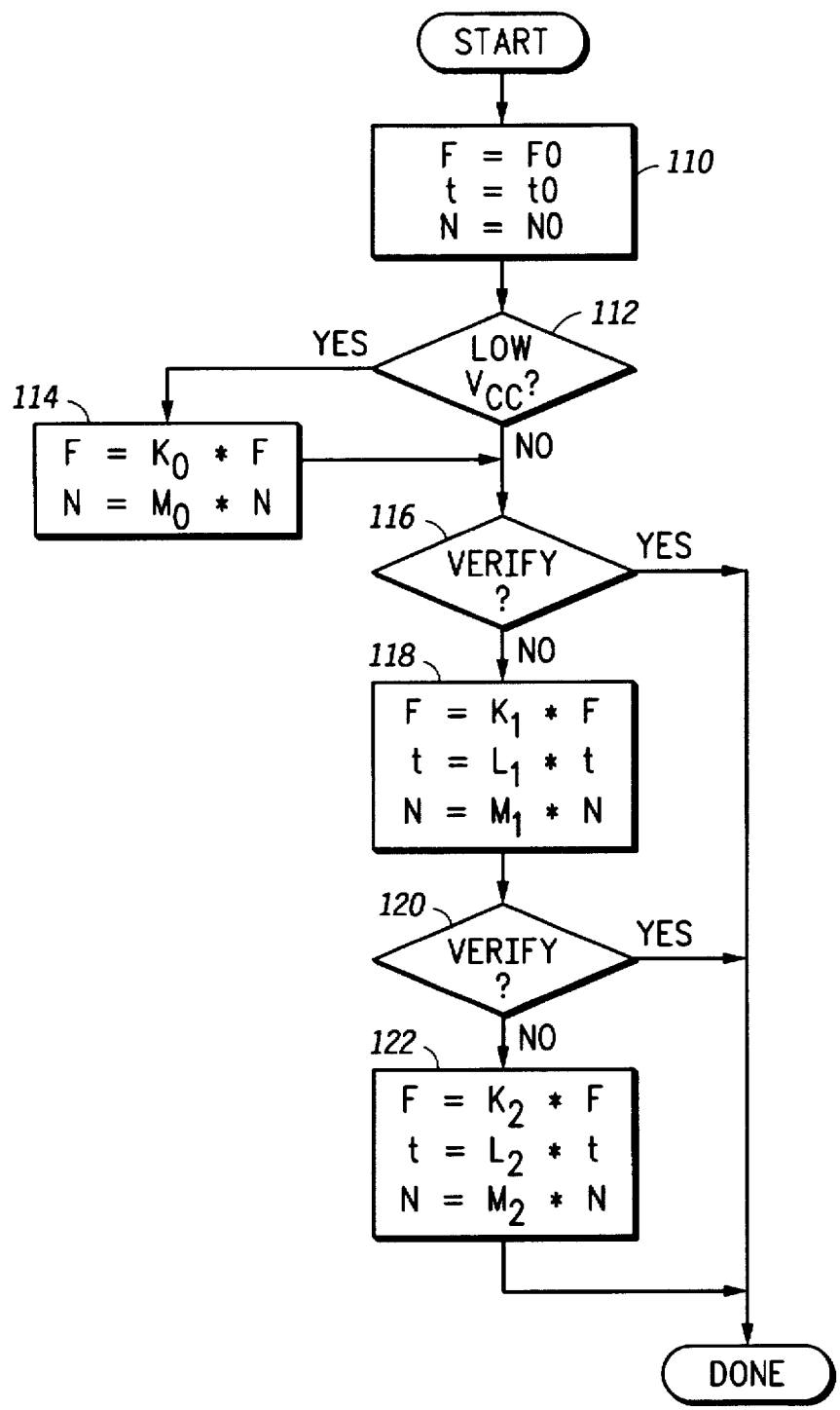
FIG. 7 illustrates a flow chart for automatically controlling the charge pump of FIG. 2 in accordance with the present invention.

FIG. 7 illustrates a flow chart for automatically controlling the charge pump of FIG. 2 in accordance with the present invention. At step 110, the frequency of clock signal CLK and CLKB is set to its initial value for providing time period 1/F0, and the counter of timer 28 are reset to an initial value. At decision step 112, low voltage detector 26 determines whether the power supply voltage provided to an integrated circuit having charge pump 20 is low (3 volts) or high (5 volts). If the power supply voltage is low, the YES path is taken from decision step 112 to step 114. At step 114, the frequency of clock generator 22 is increased by a predetermined amount and the number of pump stages of pump stages 24 is increased when control signal LOW_V is asserted, indicating a low power supply voltage, and all of the pump stages 80–86 are serially connected to provide output voltage HVOUT. If at decision step 112 a low voltage is not detected the NO path is taken to decision step 116. At decision step 116, during programming of the non-volatile array, after each programming cycle a verify cycle determines whether or not programming is successful. If programming is successful, the YES path is taken and control signal DONE is asserted indicating that programming is verified. If programming is not verified after the first programming cycle as being successfully completed, the NO path is taken from decision step 116 to step 118.

At step 118, timer 28 in FIG. 2 asserts control signal GEAR1, which increases the frequency of clock signal CLK to a second pre-determined frequency and increases the number of pump stages serially connected in pump stages 24 of FIG. 4. At decision step 120, another programming cycle is accomplished and another verified step determines if programming was successful. If programming is verified the YES path is taken, programming is complete, and control signal DONE is asserted. If programming is not verified, the NO path is taken to step 122 and timer circuit 28 asserts control signal GEAR2, which increases the frequency of clock signal CLK and increases the number of serially coupled pump stages in charge pump stages 24. Any subsequent program/verify cycles use the same clock frequency and number of pump stages as determined by control signal GEAR2. Note that in this implementation, GEAR1 and GEAR2 are shown. This is for illustrative purposes only. This invention contemplates other numbers of control signals.

Charge pump 20 provides the advantage allowing the same integrated circuit to operate at more than one power supply voltage. This eliminates the need for stocking parts which may require additional metal options or masking steps to operate in systems requiring different power supply voltage. In addition, higher temperature ranges can be accommodated because the frequency of the clock generator can be increased. In addition, yield is improved and cell performance and reliability are improved because the cells are not overstressed as much as cells using prior art charge pumps.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A charge pump system for providing a high voltage output set for use in programming and erasing non-volatile memory comprising:
    a low voltage detector generating a low voltage signal;
    a clock generator receiving the low voltage signal and a first control signal and generating a first clock signal, wherein:
        frequency of the first clock signal generated by the clock generator is responsive to the low voltage signal; and
    a charge pump receiving the low voltage signal and the first control signal and generating the high voltage output set, wherein:
        the charge pump has a plurality of stages, and
        a number of stages enabled in the charge pump is responsive to the low voltage signal.

2. The charge pump system in claim 1 wherein:
    a timer circuit responsive to the first clock signal which provides a first control signal, wherein:
        the frequency of the first clock signal and the number of stages enabled in the charge pump are responsive to the first control signal.

3. The charge pump system in claim 2 wherein:
    the timer circuit provides a second control signal; and
    the frequency of the first clock signal generated by the clock generator is responsive to the second control signal.

4. The charge pump system in claim 2 wherein:
    the timer circuit provides a second control signal; and
    the number of stages enabled in the charge pump is responsive to the second control signal.

5. The charge pump system in claim 4 wherein:
    the frequency of the first clock signal generated by the clock generator is responsive to the second control signal.

6. The charge pump system in claim 2 wherein:
    the clock generator generates a second clock signal; and
    the charge pump is responsive to the second clock signal.

7. The charge pump system in claim 6 wherein:
    the second clock signal is complementary to the first clock signal.

8. The charge pump system in claim 2 wherein:
    the charge pump comprises:
    a first logic circuit that is responsive to the low voltage signal and the first clock signal and that generates a first stage enable signal;
    the plurality of stages are grouped into a plurality of sets of stages including a base set of stages and a first set of stages in series with the base set of stages, wherein:
        the first set of stages is enabled by the first stage enable signal; and
    a first diode circuit coupled in parallel to the first set of stages wherein the first diode circuit prevents a first current from flowing against a direction of a current flow through the charge pump.

9. The charge pump system in claim 8 wherein the charge pump further comprises:
    a second logic circuit responsive to the low voltage signal, the first control signal, and the first clock signal and generating a second stage enable signal;
    the plurality of stages includes a second set of stages in series with the first set of stages and the base set of stages, wherein:
        the second set of stages is enabled by the second stage enable signal; and
    a second diode circuit coupled in parallel with the first set of stages and the second set of stages wherein the second diode circuit prevents a second current from flowing against the direction of the current flow through the charge pump.

10. The charge pump system in claim 2 wherein the clock generator comprises a first ring oscillator circuit generating the first clock signal comprising:
    a first plurality of serially coupled inverters;
    a first base capacitor circuit coupled between the first plurality of serially coupled inverters and a ground; and
    a first capacitor circuit coupled between the first plurality of serially coupled inverters and the ground comprising:
        a first capacitor serially coupled to a first gate responsive to the low voltage signal.

11. The charge pump system in claim 10 wherein the first ring oscillator circuit further comprises:
    a second capacitor circuit coupled between the first plurality of serially coupled inverters and the ground comprising:
        a second capacitor serially coupled to a second gate responsive to a first control signal.

12. The charge pump system in claim 10 wherein the clock generator further comprises a second ring oscillator circuit generating a second clock signal complementary to the first clock signal comprising:
    a second plurality of serially coupled inverters;
    a second base capacitor circuit coupled between the second plurality of serially coupled inverters and the ground; and
    a second capacitor circuit coupled between the second plurality of serially coupled inverters and the ground comprising:
        a second capacitor serially coupled to a second gate responsive to the low voltage signal.

13. A memory system using the charge pump in claim 2 which further comprises:

a program/erase/verify control circuit which provides a set of high voltage column control signals and a set of high voltage word line control signals;

a word line driver circuit utilizing the high voltage output set, responsive to a set of row address signals and the set of high voltage word line control signals, and generating a set of row control signals;

a column logic circuit responsive to a set of column address signals and the set of high voltage column control signals, and generating a set of column control signals; and a memory array comprising a plurality of memory cells responsive to the set of column control signals and the set of row control signals.

14. The memory system in claim 13 wherein:

the program/erase/verify control circuit generates a start signal and a done signal; and the timer circuit is responsive to the start signal and to the done signal in determining whether to assert the first control signal.

15. The memory system in claim 13 wherein:

the memory array comprises EEPROM memory.

16. The memory system in claim 13 wherein:

the memory array comprises Flash memory.

17. The memory system in claim 13 wherein:

the word line driver circuit utilizes the high voltage output set to erase one of the plurality of memory cells.

18. The memory system in claim 13 wherein:

the column logic circuit utilizes the high voltage output set to program one of the plurality of memory cells.

19. The memory system in claim 13 wherein:

the word line driver circuit utilizes the high voltage output set to program one of the plurality of memory cells.

20. The memory system in claim 13, wherein the high voltage output set is a first high voltage output set, and which further comprises:

a second charge pump responsive to the low voltage signal and generating a second high voltage output set, wherein:

the word line driver circuit utilizes the first high voltage output set to program one of the plurality of memory cells; and the column logic circuit utilizes the second high voltage output set to program one of the plurality of memory cells.

21. A method for programming and verifying the programming of a non-volatile memory cell, the method comprising the steps of:

providing a programming voltage for a first duration and a first magnitude to program the non-volatile memory cell;

verifying that the non-volatile memory cell was not successfully programmed; and providing the programming voltage for a second duration and a second magnitude to program the non-volatile memory cell.

22. The method of claim 21, further comprising the steps of:

verifying that the non-volatile memory cell was not successfully programmed; and providing the programming voltage for a third duration and a third magnitude to program the non-volatile memory cell.

23. The method of claim 21, further comprising the step of:

providing the programming voltage at a third duration and a third magnitude for each successive programming cycle of the non-volatile memory cell until the non-volatile memory cell is successfully programmed.

24. A method for generating a high voltage output set for use in programming and erasing non-volatile memory in a system, the method comprising the steps of:

testing a power level to determine whether the system is in low power state;

generating a low power signal if the system is determined to be in the low power state; and generating a clock signal at a first frequency if the low power signal is being asserted and generating the clock signal at a second frequency if the low power signal is not being asserted.

25. The method in claim 24 which further comprises:

generating a high voltage output set utilizing the clock signal.

26. A method for generating a high voltage output set for use in programming and erasing non-volatile memory, the method comprising the steps of:

A) selecting a specified clock frequency;

B) performing a first program verification utilizing a clock circuit that generates a clock signal at the specified clock frequency;

C) if the first program verification was not successful, modifying the specified clock frequency by multiplying the specified clock frequency by a first constant; and D) modifying a cell in the non-volatile memory utilizing a high voltage output set from a charge pump driven by the clock circuit generating the clock signal at the specified clock frequency.

27. The method in claim 26 which further comprises:

E) if the first program verification was not successful in step (C), performing a second program verification utilizing the clock circuit to generate a clock signal at the specified clock frequency; and F) if the second program verification was not successful in step (E), modifying the specified clock frequency by multiplying the specified clock frequency by a second constant.

28. The method in claim 27 wherein step (A) comprises:

1) testing a power level to determine whether the charge pump is in low power state; and 2) selecting a first clock frequency as the specified clock frequency when the charge pump is not in a low power mode and selecting a second clock frequency as the specified clock frequency when the charge pump is in the low power mode.

* * * * *